(12) United States Patent
Frosien (10) Patent No.: US 9,601,303 B2
(45) Date of Patent: Mar. 21, 2017

(54) CHARGED PARTICLE BEAM DEVICE AND METHOD FOR INSPECTING AND/OR IMAGING A SAMPLE

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT INTEGRATED CIRCUIT TESTING GESELLSCHAFT FÜR HALBLEITERPRÜFTECHNIK MBH, Heimstetten (DE)

( * ) Notice: Subject to any disclaimer, the term of this patent is extended or adjusted under 35 U.S.C. 154(b) by 0 days.

(21) Appl. No.: 14/825,055

(22) Filed: Aug. 12, 2015

(65) Prior Publication Data

US 2017/0047192 A1 Feb. 16, 2017

(51) Int. Cl.
*G21K 5/04* (2006.01)
*H01J 37/26* (2006.01)
*H01J 37/145* (2006.01)

(52) U.S. Cl.
CPC .......... *H01J 37/145* (2013.01); *H01J 37/261* (2013.01); *H01J 2237/04* (2013.01); *H01J 2237/10* (2013.01); *H01J 2237/2602* (2013.01)

(58) Field of Classification Search
USPC ... 250/396 R, 397, 398, 305, 306, 307, 309, 250/310, 311, 492.1, 492.3
See application file for complete search history.

(56) References Cited

U.S. PATENT DOCUMENTS 6,407,388 B1 * 6/2002 Frosien .................. G01N 23/20
250/310

* cited by examiner

*Primary Examiner* — Nicole Ippolito
(74) *Attorney, Agent, or Firm* — Kilpatrick Townsend & Stockton LLP (57) ABSTRACT

A charged particle beam device for imaging and/or inspecting a sample is described. The charged particle beam device includes a beam emitter for emitting a primary charged particle beam; and a retarding field device for retarding the primary beam before impinging on the sample, the retarding field device including a magnetic-electrostatic objective lens and a proxy electrode. The charged particle beam device is adapted for guiding the primary beam along an optical axis to the sample for generating secondary particles released from the sample and backscattered particles. The proxy electrode comprises a first opening allowing the passage of the primary beam and at least one second opening for allowing the passage of off-axial backscattered particles. Further, a proxy electrode and a method for imaging and/or inspecting a sample by a charged particle beam are described.

18 Claims, 4 Drawing Sheets

CHARGED PARTICLE BEAM DEVICE AND METHOD FOR INSPECTING AND/OR IMAGING A SAMPLE

TECHNICAL FIELD

Embodiments of the present invention relate to devices for imaging a sample with one or more charged particle beams and relate to a charged particle beam device having a retarding field device. Embodiments of the present invention particularly relate to an electron beam wafer inspection system for inspecting 3D structures or structures with a high aspect ratio. Embodiments described herein also relate to a method for inspecting and/or imaging a sample with a charged particle beam device.

BACKGROUND

Charged particle beam apparatuses have many functions, in a plurality of industrial fields, including, but not limited to, critical dimensioning of semiconductor devices during manufacturing, defect review of semiconductor devices during manufacturing, inspection of semiconductor devices during manufacturing, exposure systems for lithography, detecting devices and testing systems. Thus, there is a high demand for structuring, testing and inspecting specimens or samples within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

In recent years, inspection and/or imaging of 3D structures or structures having large aspect ratios (such as large ratios of depth to opening width) becomes increasingly desired. Devices like 3D FinFETs and 3D NANDs have structures with large aspect ratios which are difficult to image in scanning electron microscopes (SEMs) using the secondary electrons (SE). SEs can hardly escape from the structures having high aspect ratios and cannot be detected with reasonable signal to noise ratio. In particular, the bottom critical dimension (CD)-measurement of high aspect ratio trenches and contact holes is a challenge. Image modes which use backscattered electrons (BSE) are used for increasing the quality of imaging and/or inspection, especially in the semiconductor industry. However, in known systems, the BSE detection has an undesired impact on the primary beam performance (e.g. the resolution).

In view of the above, it is an object of embodiments described herein to provide a charged particle beam device, a proxy electrode, and a method for inspecting and/or imaging a sample that overcome at least some of the problems in the art.

SUMMARY

In light of the above, a charged particle beam device, a proxy electrode, and a method for inspecting and/or imaging a sample according to the independent claims are provided. Further aspects, advantages, and features are apparent from the dependent claims, the description, and the accompanying drawings.

According to one embodiment, a charged particle beam device for imaging and/or inspecting a sample is provided. The charged particle beam device includes: a beam emitter for emitting a primary charged particle beam; and a retarding field device for retarding the primary beam before impinging on the sample. The retarding field device comprises a magnetic-electrostatic objective lens and a proxy electrode. The charged particle beam device is adapted for guiding the primary beam along an optical axis to the sample for generating secondary particles released from the sample and backscattered particles. The proxy electrode includes a first opening allowing the passage of the primary beam and at least one second opening for allowing the passage of off-axial backscattered particles.

According to another embodiment, a proxy electrode for a charged particle beam device is provided. The proxy electrode includes a first opening allowing the passage of a primary charged particle beam of the charged particle beam device and a at least one second opening for allowing the passage of off-axial backscattered particles of the charged particle beam device.

According to a further embodiment, a method for imaging and/or inspecting a sample by a charged particle beam device having a column and an optical axis is provided. The method includes emitting a primary beam of charged particles and guiding the primary beam in the column of the charged particle beam device. The method further includes focusing and retarding the primary beam by a retarding field device. The retarding field device includes a magnetic-electrostatic objective lens and a proxy electrode between the magnetic-electrostatic objective lens and a sample stage for supporting a sample during imaging and/or inspection. The primary charged particle beam passes through the proxy electrode through a first opening. The method further includes passing of off-axial backscattered particles through the proxy electrode through at least a second opening in the proxy electrode; and detecting the backscattered particles by a first detector and detecting secondary particles released from the sample by a second detector.

Embodiments are also directed at apparatuses for carrying out the disclosed methods and include apparatus parts for performing each described method feature. The method features may be performed by way of hardware components, a computer programmed by appropriate software, by any combination of the two or in any other manner. Furthermore, embodiments are also directed at methods with which the described apparatus operates. It includes method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION OF EMBODIMENTS

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as an electron beam device including the detection of secondary electrons and/or backscattered electrons, which together are also referred to as signal electrons. The embodiments described herein can still be applied for apparatuses and components detecting corpuscles such as secondary and/or backscattered charged particles in the form of electrons or ions, photons, X-rays or other signals in order to obtain a sample image or inspection result. Generally, when referring to corpuscles they are to be understood as a light signal in which the corpuscles are photons as well as particles, in which the corpuscles are ions, atoms, electrons or other particles.

A "specimen", "sample" or "wafer" as referred to herein, includes, but is not limited to, semiconductor wafers, semiconductor workpieces, and other workpieces such as memory disks and the like. Embodiments may be applied to any workpiece which is structured or on which material is deposited. A specimen, a sample or wafer includes a surface to be imaged and/or structured or on which layers are deposited, an edge, and typically a bevel. According to some embodiments, which can be combined with other embodiments described herein, the apparatus and methods are configured for or are applied for electron beam inspection (EBI), critical dimension measurement and defect review applications, where the microscopes and methods according to embodiments described herein can be beneficially used in light of the desire for high throughput of the named applications. According to some embodiments described herein, an E-beam inspection (EBI), critical dimension measurement (CD) tool, and/or defect review (DR) tool can be provided, wherein high resolution, large field of view, and high scanning speed can be achieved.

According to embodiments described herein, a wafer imaging system or a wafer SEM inspection tool refers to EBI tools, CD tools or DR tools, which are specific tools as understood by a person skilled in the art.

According to embodiments described herein, a charged particle beam device for imaging and/or inspecting a sample is provided. The charged particle beam device includes a beam emitter for emitting a primary beam of charged particles and a retarding field device for retarding the primary beam before impinging on the sample. The retarding field device includes a magnetic-electrostatic objective lens and a proxy electrode. According to embodiments described herein, the charged particle beam device is adapted for guiding the primary beam in a column of the charged particle beam device along an optical axis to the sample for generating secondary particles released from the sample and backscattered particles bouncing off the sample. The proxy electrode includes a first opening allowing the passage of the primary charged particle beam and at least one second opening for allowing the passage of off-axial backscattered particles. In some embodiments, the first opening for the primary beam is approximately aligned with the optical axis of the charged particle beam device.

Generally, a primary beam travels through a charged particle beam device before hitting a sample to be imaged and/or inspected. When a primary beam impinges on the sample, different reactions appear on or in the sample. For instance, secondary particles are released from the sample. The primary beam impinging on the sample dissociates other particles in the sample, in particular by the energy provided by the particles of the primary beam. The dissociated particles resolved from the sample by the particles of the primary beam are denoted as secondary particles. The secondary particles, after being dissolved from the sample, leave the sample and can be detected by a suitable detector. But the primary beam causes a further effect: the particles of the primary beam bounce off the sample (either from the surface or after entering into the sample to a certain depth) and leave the sample again. The particles of the primary beam bouncing off the sample and leaving the sample are denoted as backscattered particles. Also the backscattered particles can be detected under some conditions. Typically, the secondary particles and the backscattered particles may together be referred to as signal particles or signal electrons.

In particular, the detection of backscattered electrons becomes increasingly desirable for the imaging and inspection of 3-D structures in the semiconductor industry. For instance, devices like 3D FinFETs and 3D NANDs have structures with large aspect ratios which are difficult to image in charged particle beam devices using the secondary particles. For instance, the large aspect ratio may be understood as a ratio of the depth of the structure in the sample to the opening width of the structure being about 5:1 or higher, such as 10:1 of even 20:1 or higher. In one simplified example, the structure may be a substantially cylindrical hole in the sample, providing a depth into the sample and a width corresponding approximately to the diameter of the substantially cylindrical hole, as will be explained in more detail below.

Secondary particles, such as secondary electrons, can hardly escape from the large aspect ratio structures and cannot be detected with reasonable signal to noise ratio, in particular the bottom CD-measurement of high aspect ratio trenches and contact holes is a challenge. According to embodiments described herein, backscattered particles can be used for operation modes for imaging and/or inspecting the structures with large aspect ratios. Backscattered particles can leave holes and trenches because the backscattered particles have enough energy to get out and extraction fields are not necessarily used for detecting the backscattered particles, as used for the secondary particles. Further, under suitable (moderate) landing energies of the primary beam, the backscattered particles can pass through side walls and can leave the sample so that a larger number of backscattered particles can contribute to the overall backscattered particles signal. Efficient backscattered particles detector arrangements are desired that can detect small angle backscattered particles (which have left high aspect ratio features) as well as arrangements which can detect large angle backscattered particles which have passed through surrounding materials.

According to some embodiments, a small angle of backscattered particles may be understood as an angle of about 0° to about 15° to the optical axis of the charged particle beam device. According to some embodiments described herein, a large angle of backscattered particles may be understood as an angle of about 20° to about 75° to the optical axis of the charged particle beam device.

According to some embodiments, an "optical axis" of a charged particle beam device or an optical arrangement is an imaginary line that defines the path along which the primary beam propagates through the device or the system. For instance, in a charged particle beam device including electron beam optical elements, the axis may pass through the center of the elements. The optical axis may be coincident with the mechanical or geometrical symmetry axis of the system, but does not necessarily have to be.

In the following description of the figures, a charged particle beam device is shown and described as being an electron beam device. The electron beam device serves as an example and does not limit the embodiments to an electron beam, as mentioned before.

Figure 1:
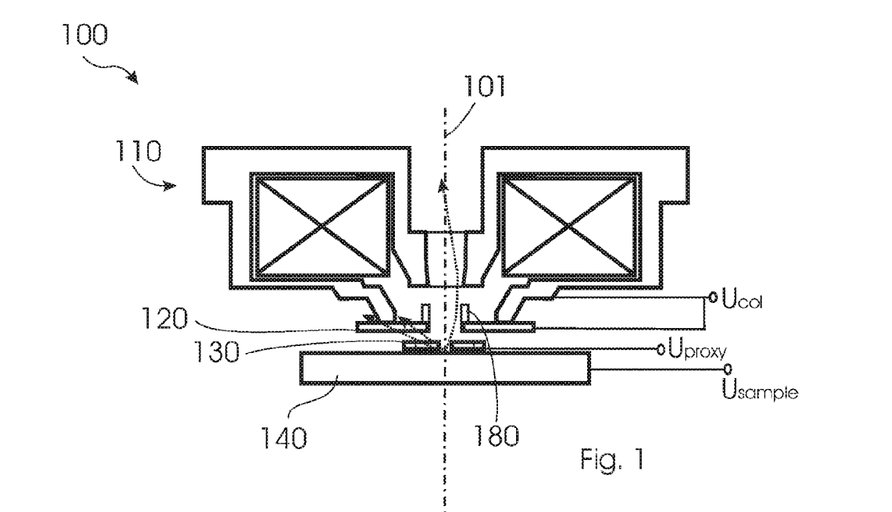
FIG. 1 shows a detailed view of a retarding field device in a charged particle beam device according to embodiments described herein.

FIG. 1 shows an example of a retarding field device 100 according to embodiments described herein. The retarding field device 100 includes an electrostatic-magnetic objective lens 110 and a proxy electrode 130. Generally, in a retarding field device, the electron energy inside the column is reduced to the final landing energy. Overall performance of the retarding field device may for instance be determined by the immersion factor which is the ratio of the column energy to the landing energy. The higher the immersion energy, the better the performance is.

In some embodiments described herein, the retarding field device is adapted for generating an extraction field for the secondary particles released from the sample. For instance, the objective lens acting as a retarding lens for the primary beam may act as an accelerating lens for the secondary particles. The objective lens may be controlled so as to adjust the operational parameter for the purpose of decelerating the primary beam and accelerating the secondary particles. For low landing energies and low SE-extraction fields, the focal power of the objective lens tends to be more and more performed by the electrostatic retarding field lens device.

In the context of the here described embodiments, without limiting the scope of protection, a retarding device for a charged particle beam device intends to describe a device for a charged particle beam with initial high acceleration of the charged particles which will be decelerated to a landing energy shortly before striking the specimen or wafer. The energy or velocity ratio $v_{acc}/v_{landing}$ between the acceleration velocity $v_{acc}$ at which the charged particles are guided through the column of the charged particle beam device and the landing velocity $v_{landing}$ at which the charged particles strike the specimen can be about at least 4 or higher, e.g. 8 or higher. Furthermore, the landing energy can be 10 keV or less, e.g. 5 keV or less, such as 1 keV.

According to some embodiments, the proxy electrode may be understood as being the closest electrode of the charged particle beam device to the sample or the sample stage. In one example, the distance between the proxy electrode and the sample stage or the sample is smaller than the distance between the magnetic-electrostatic objective lens and the sample stage or the sample. According to some embodiments, the distance between an element and the sample stage or sample may be determined by the distance between the surface of the element facing the sample stage (or sample) and the surface of the sample stage (or sample).

In FIG. 1, the optical axis of the retarding field device 100 is denoted with reference sign 101 in the figures. The example of a retarding field device of FIG. 1 further shows a sample 140, which may be provided on a sample stage (not shown). According to some embodiments described herein, the retarding field device 100 includes a first detector 120 for the backscattered particles, which have passed through the proxy electrode. The first detector 120 may be placed within the objective lens body of the retarding field device and is referred to in detail below.

The charged particle beam device according to embodiments described herein allows the conventional secondary particles and small angle backscattered particles detection through the (objective) lens to be kept. Embodiments described herein can add an efficient large angle backscattered particle detection avoiding a negative impact on the primary beam performance, in particular on the resolution (such as spot size).

According to some embodiments described herein, enabling a detection of large angle backscattered particles may be achieved by using the proxy electrode as entrance window for the large angle backscattered particle detection. The proxy electrode can also be used to decelerate the primary beam as part of the retarding field device or retarding field lens. The proxy electrode may further be able to control the extraction field strength for the secondary particles.

Typically, the proxy electrode may have a first opening for the passage of the primary beam. The first opening is arranged substantially at the position of the optical axis of the charged particle beam device and/or may be arranged and placed to substantially coincide with the optical axis of the charged particle beam device. For instance, the first opening is adapted and placed for letting the primary beam pass through the proxy electrode on the way to the sample. In some embodiments, the first opening includes the (geometrical) center of the proxy electrode. The primary beam may, at least on the way through the retarding field device, travel substantially along the optical axis, as indicated as optical axis 101 in FIG. 1. More details of embodiments of a proxy electrode 130 (especially in a view from below the charged particle beam device) are shown in FIGS. 2a to 2d described below.

According to embodiments described herein, the proxy electrode includes a second opening for allowing the passage of off-axial backscattered particles. According to some embodiments described herein; off-axial backscattered particles may be understood as large angle backscattered particles. In particular, off-axial backscattered particles do not substantially travel along the optical axis of the charged particle beam device. In some embodiments, off-axial backscattered particles may be understood as backscattered particles travelling at an angle of larger than typically about 20°, more typically larger than about 25° and even more typically larger than 30° from the optical axis of the charged particle beam device. For instance, a backscattered particle bouncing off the sample at an angle larger than about 20° from the optical axis may be denoted as an off-axial backscattered particle.

FIG. 1 shows some examples of backscattered particles by arrows. The arrow arranged at the right side of the optical axis 101 (as seen in the plane of projection of FIG. 1) may be understood as showing axial backscattered particles. Axial backscattered particles travel through the first opening of the proxy electrode 130 due to the proximity of the particles to the optical axis (e.g. a proximity within a 10° angle from the optical axis). The axial backscattered particles may be deflected by deflector 180 and may be detected within or after the objective lens (when seen in the travelling direction of the backscattered particles). The two arrows at the left side of the optical axis (again seen in the plane of projection of FIG. 1) show examples of off-axial backscattered particles having an angle of larger than about 20° to the optical axis 101. For instance, one of the arrows may have an angle of about 45° to the optical axis 101, and the other arrow may have an angle of about 65° to the optical axis. The off-axial backscattered particles can pass through the second openings of the proxy electrode according to embodiments described herein.

In some embodiments, the second opening(s) of the proxy electrode may be denoted as an off-axial opening of the proxy electrode. An off-axial opening of the proxy electrode may be understood as an opening arranged and/or placed for letting off-axial particle beams pass. According to some embodiments, an off-axial opening may be described as an opening not including the optical axis of the charged particle beam or the center of the proxy electrode.

With a proxy electrode according to embodiments described herein, backscattered particles starting under large emission angles can "penetrate" the proxy electrode and can reach a first detector arrangement which is situated between proxy electrode and objective lens. The detector itself (e.g. scintillator or pin diode) can be integrated into the objective lens without the need of focal length or working distance (WD) increase because of mechanical design flexibility.

Since the objective lens of the retarding field device has a significant potential difference between sample and column of the charged particle beam device of typically 5 keV, 15 keV or even larger than 30 kV, backscattered particles penetrating the proxy windows are accelerated before reaching the detector which is advantageous for high efficiency detection. Accelerating the backscattered particles is in particular beneficial when detecting backscattered particles at low landing energy (e.g. of below 10 keV, e.g. below 3 keV or even 1 keV) or when backscattered particles have lost part of their energy when travelling through the sample material. In the case that the column is on ground potential and landing energy is defined as the difference between cathode potential and sample potential, detection with semiconductor devices like pin diodes may practicable to realize because detector as well as detector electronics is also on ground potential.

Generally, a short working distance (WD) is desired for high resolution SEMs. The state of the art detection method in retarding field SEMs is through the lens detection. The retarding field optics (compound optics) for the primary beam generates an extraction field for the secondary particles and the backscattered particles. While most of the secondary particles can be gathered by the extraction field and are focused through the objective lens, only a small amount of backscattered particles is accepted by the objective lens (such as small angle backscattered particles) because the extraction field has a limited impact on the higher energy backscattered particles. After the passage through the objective lens, backscattered particles and secondary particles can be separated and can be detected independently. As a consequence, nearly all secondary particles and small angle backscattered particles can be detected in high resolution SEMs of the state of the art. In order to detect the large angle backscattered particles, post lens backscattered particles detectors are used in known systems. A configuration with a post lens detector has the drawback that the effective focal length of the objective lens and the aberrations of the objective lens will be increased, even if the backscattered particles detector is built as flat as possible.

A charged particle beam device according to embodiments described herein, and especially a proxy electrode according to embodiments described herein, helps to avoid the problems of systems known in the art and help at the same time to detect the large angle backscattered particles. Detecting the large angle backscattered particles increases the amount of information obtained when inspecting and/or imaging the sample. The quality of the image or the inspection result also increases. The backscattered particles detection according to embodiments described herein allows efficient backscattered particles detection at a wide range of primary beam landing energy without optical design modifications, which may have an negative impact on the primary beam performance.

Figure 2A:
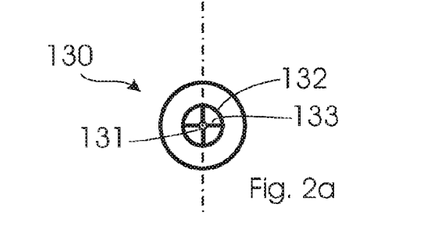
FIGS. 2a to 2d shows a schematic view of a proxy electrode for a charged particle beam device according to embodiments described herein.

FIG. 2a shows an embodiment of a proxy electrode 130 having a first opening 131 for letting the primary beam pass and at least one second opening 132 for letting the backscattered particles pass. According to some embodiments, the second opening 132 is divided in sections by beams 133 or bars 133, such as stabilizer bars.

According to some embodiments described herein, the second opening of the proxy electrode may be denoted or may act as an entrance window for the backscattered particles. The entrance window in the proxy electrode may have different shapes: such as a ring, ring segments, one or more circular or rectangular openings distributed in the circumferential direction and/or the radial direction, or may have any other suitable shape for enabling backscattered particles having a large angle to the optical axis of the charged particle beam device (e.g. angles larger than 20°) to pass through the proxy electrode. In some embodiments, a superimposed conductive grid may be used to reduce the electrical field penetration from the column of the charged particle beam device to the sample in order to avoid possible impacts on the primary beam. According to some embodiments, which may be combined with other embodiments described herein, a proxy electrode shaped as a grid with a central hole is in the scope of the application. In some embodiments, the proxy electrode is designed and operated to act as a substantially equi-energetic plane for the primary beam. Some of the examples of proxy electrode designs are shown in the following figures, which does not present a limitation to the possible shapes and designs of proxy electrodes within the scope.

According to some embodiments, the second opening may surround the first opening. For instance, the second opening may be limited by the surrounding of the first opening at the one side (e.g. the inner side) and by the electrode material at the other side (e.g. the outer side). In some embodiments, the area of the second opening may be defined by the area encompassed by the outer border of the second opening minus the area of the first opening.

Figure 2B:
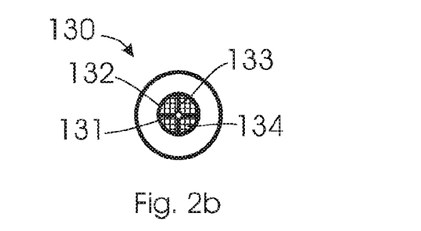

FIG. 2b shows an example of a proxy electrode 130 having a first opening 131 for the primary beam and a second opening 132 for the backscattered particles. As in FIG. 2a, stabilizing bars 133 are provided for stabilizing the second opening 132. In the example shown in FIG. 2b, a conductive grid 134 is superimposed onto the second opening 132 of the proxy electrode. According to some embodiments, the grid 134 may be chosen and dimensioned so as not to disturb the path of the backscattered particles passing through the second opening 132. In some embodiments, the grid 134 may be provided as structural part of the proxy electrode 130. According to some embodiments, the conductive grid 134 may be provided in a small (within some millimeters) distance to the proxy electrode. For instance, the conductive grid 134 may be provided with a separate power supply.

Figure 2C:
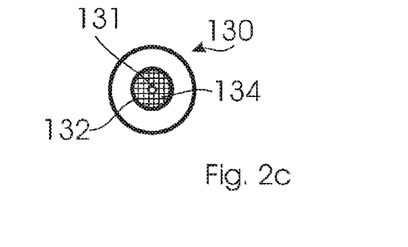

FIG. 2c shows an example of a proxy electrode 130 according to embodiments described herein. The proxy electrode 130 includes a first opening 131 for the primary beam and a second opening 132 for the backscattered particles. A grid 134 is provided as a structural part of the proxy electrode in the second opening 132. Typically, the grid 134 may also be used to take over the task of stabilizing the second opening 132 of the proxy electrode 130 without losing the intended purpose of reducing and/or avoiding the impact on the primary beam.

Figure 2D:
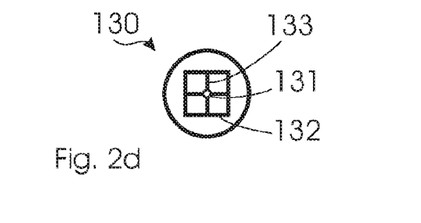

FIG. 2d shows an example of a proxy electrode according to some embodiments described herein. The proxy electrode 130 includes a first opening 131 for the primary beam and a second opening 132 for the backscattered particles. The second opening 132 of the example of a proxy electrode shown in FIG. 2d has a substantially rectangular, in particular a substantially quadratic shape. The second opening 132 is divided into sections by bars 133, which may be denoted as stabilizing bars as explained above.

According to embodiments described herein, the term "substantially" as used herein may mean that there may be a certain deviation from the characteristic denoted with "substantially." For instance, the term "substantially rectangular" refers to a shape which may have certain deviations from the exact rectangular shape, such as a deviation of about 1 to 10% of the general extension in one direction, or of the angle of each corner of the rectangle. According to a further example, the term "substantially at a position" may refer to positioning an element within a range around the position, such as a range of about some percent of the total extension of the element, e.g. up to 10% of the extension of the element to be positioned.

Figure 3A:
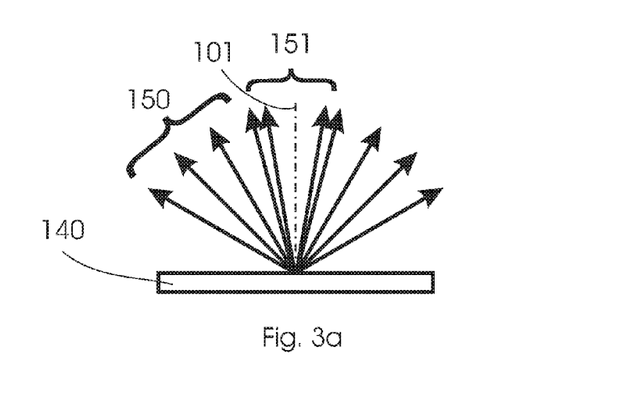
FIGS. 3a to 3e show different examples of backscattering secondary particles on a sample according to embodiments described herein.

FIGS. 3a to 3e show different situations of backscattered particles. FIG. 3a shows a simplified example of a backscattering situation upon impingement of a primary beam on a sample 140. Depending on the sample surface, the energy of the primary beam, the materials of the sample and other parameters, the particles of the primary beam bounce off the sample and are backscattered into the direction from which the primary beam came as backscattered particles. For explaining the terms used in the context of the description, FIG. 3a shows a range of angles provided by the backscattered particles. The angle of the backscattered particles depends on several parameters, such as the parameters mentioned above, the impingement angle of the primary beam, the sort of particles in the primary beam and the like. FIG. 3a shows examples of possible backscattering angles. The skilled person may understand that the exemplarily shown angles do not limit the angles generally and potentially provided by backscattered particles. The backscattered particles move in a direction away from the sample 140. Some of the backscattered particles 151 are classified as belonging to the "small angle backscattered particles" according to some embodiments described herein. The small angle may be an angle to the optical axis 101 of the charged particle beam device of between 0° and about 15°. Some of the backscattered particles 150 are classified as belonging to the "large angle backscattered particles" according to some embodiments described herein. The large angle may be an angle to the optical axis 101 of the charged particle beam device of typically between about 20° and about 90°, more typically between about 20° and about 80°, and even more typically between about 20° and about 75°. The skilled person may understand that a large angle may range to about 90°, but that due to practical reasons, the proxy electrode according to embodiments described herein mainly allows the passage of backscattered particles having an angle less than 90° to the optical axis 101.

Figure 3B:
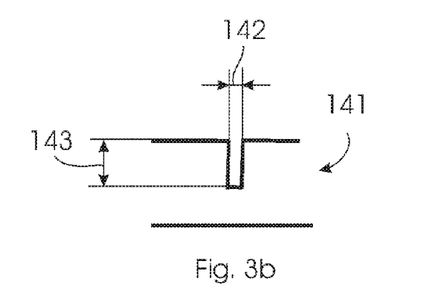

FIG. 3b shows a structure 141 of a sample 140 including a substantially cylindrical hole in the sample 140. The structure 141 has a width 142 and a depth 143 into the sample. Typically, the width 142 of a substantially cylindrical hole may be determined by determining the diameter of the hole. According to some embodiments described herein, the structure 141 exemplarily shown in FIG. 3b has a high aspect ratio, which may be—according to some embodiments described herein—an aspect ratio of 3:1 or larger, typically 10:1 or larger. The aspect ratio may be determined by the ratio of the depth to the width of the structure to be inspected and/or measured by the charged particle beam device according to embodiments described herein.

Figure 3C:
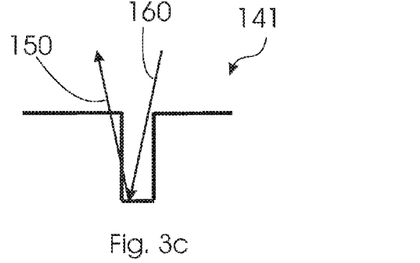

FIG. 3c shows the structure 141 in the sample 140 of FIG. 3b having a large aspect ratio. A primary beam 160 hits the bottom of the structure 141 in the sample 140. While secondary particles could not escape from the deep structure 141, the backscattered particles 150 may pass through the walls of the structure and may leave the sample at a large angle as explained above. The proxy electrode according to embodiments described herein and the charged particle beam device according to embodiments described herein allow the detection of backscattered particles leaving the sample at a large angle.

Figure 3D:
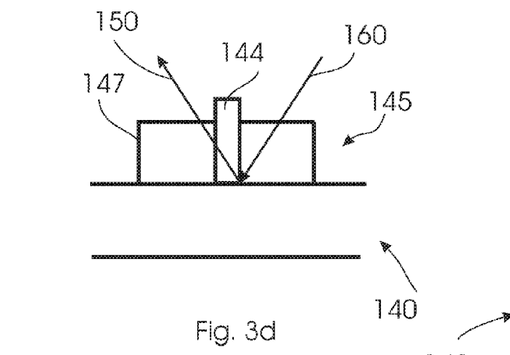

FIG. 3d shows an example of a structure 145 present on or in the sample 140. Typically, the structure 145 may be a FinFET structure, a part of a FinFET structure or the like. Different materials 147 and 144 may be used for the structure 145 to be inspected and/or imaged. According to some embodiments, the primary beam 160 may impinge on the structure, e.g. at the border between the different materials 147 and 144. Backscattered particles 150 may result due to the impingement. The backscattered particles may have a large angle to the optical axis of the charged particle beam device, when leaving the sample 140.

Figure 3E:
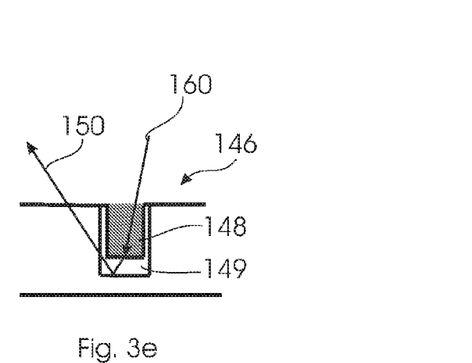

FIG. 3e shows an example of a structure 146 in or on the sample 140. The structure 146 may be a 3D NAND structure, a part of a 3D NAND structure, or the like. Different materials (such as a first material 148 of the NAND structure and a second material 149 of the NAND structure) are provided in a hole in the sample 140 in structure 146. According to some embodiments, the primary beam 160 may pass through the first material 148 and the second material 149. As an example, FIG. 3e shows different deflection angles in the first material 148 and the second material 149. At the bottom of the structure 146, the primary beam bounces off and backscattered particles 150 pass through the second material 149 and the material of the sample 140. The skilled person may understand that the figures only refer to simplified examples. For instance, regarding FIG. 3e, the skilled person may understand that backscattered particles may also come from the overall volume and also from the first material 148 and the interface of the materials 148/149. For the sake of a better overview, only the backscattered particles from the interface of the second material 149 to the sample material are shown. According to some embodiments, the backscattered particles (having e.g. lost energy when travelling through the different materials) may be accelerated, in particular by an electrostatic field of the retarding field device. The backscattered particles 150 may leave the structure 146 with a large angle as explained above and may pass through the proxy electrode allowing a following detection of the backscattered particles. According to some embodiments, the behavior of the primary beam (e.g. whether the primary beam passes through different materials, or at which border of different materials the primary beam bounces off, or the like) may depend on operational parameters, such as energy of the primary beam, landing angle of the primary beam, type of the primary beam, optical elements used in the charged particle beam device. The behavior of the primary beam may also depend on sample related parameters, such as material of the sample, structures present on or in the sample, materials used for the structure, temperature of the sample, charge of the sample, and the like.

Figure 4:
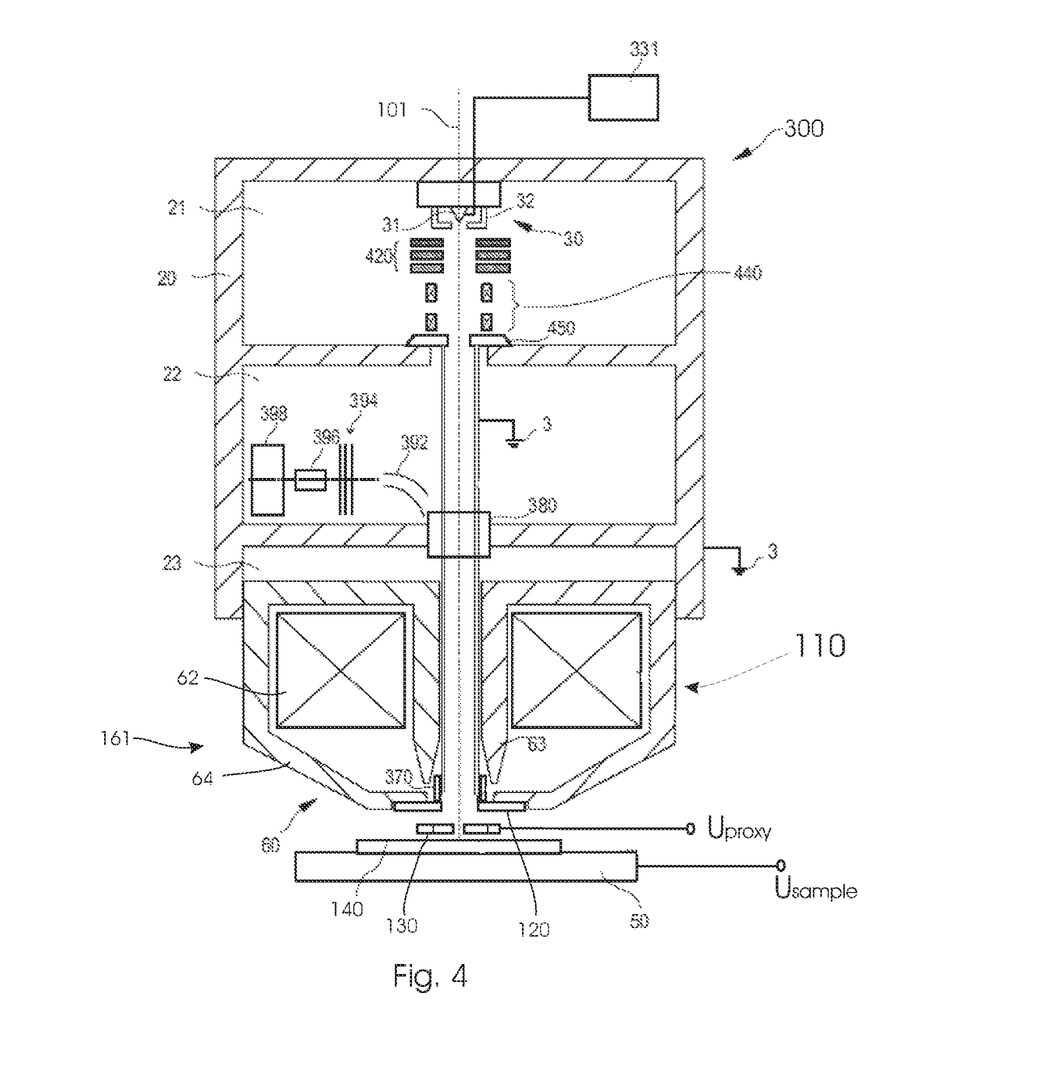
FIG. 4 shows a schematic view of a retarding field scanning charged particle beam device according to embodiments described herein.

FIG. 4 shows a charged particle beam device 300, such as an SEM imaging apparatus, i.e. a wafer imaging system. The electron beam column 20 provides a first chamber 21, a second chamber 22 and a third chamber 23. The first chamber, which can also be referred to as a gun chamber, includes the electron source 30 having an emitter 31 and suppressor 32.

According to embodiments described herein, the emitter is connected to a power supply 331 for providing a voltage to the emitter. For the examples described herein, the potential provided to the emitter is such that the electron beam is accelerated to an energy of 20 keV or above. Accordingly, typically the emitter is biased to a potential of −20 keV or higher negative voltages. As described above, having the emitter 31 on a negative potential is a typical embodiment with the benefits that the column and the beam guiding tube can be at ground or at a moderate potential.

An electron beam is generated by the electron beam source 30. In the example of FIG. 4, the beam is aligned to the beam limiting aperture 450, which is dimensioned to shape the beam, i.e. blocks a portion of the beam. The beam may then pass through the beam separator 380, which separates the primary electron beam and the secondary electron beam (and, as the case may be, the small angle backscattered electrons). The primary electron beam is focused on the sample or wafer 140 by the objective lens. The sample may be positioned on a sample position on the sample stage 50. On impingement of the electron beam, for example, secondary or backscattered electrons are released from the sample 140. The detector 398 may detect the secondary and small angle backscattered electrons and may be denoted as a second detector for a charged particle beam device according to embodiments described herein.

According to some embodiments, which can be combined with other embodiments described herein, a condenser lens 420 and a beam shaping or beam limiting aperture 450 is provided. The two-stage deflection system 440 is provided between the condenser lens and the beam shaping or limiting aperture 450 for alignment of the beam to the aperture.

As shown in FIG. 4, the objective lens has a magnetic lens component 161 having pole pieces 64/63 and a coil 62, which focuses the charged particle beam on the sample 140. The objective lens shown in FIG. 4 includes the upper pole piece 63, the lower pole piece 64 and the coil 62 forming a magnetic lens component 60 of the objective lens. Further, one or more electrodes may be provided for forming an electrostatic lens component of the objective lens.

According to the embodiments described herein, the magnetic lens component and the electrostatic lens component substantially overlap each other to form a compound lens. In order to achieve the combination of the magnetic lens component and the electrostatic lens component, the two fields substantially overlap with each other according to embodiments. Within one meaning of the embodiments, it is to be understood that areas formed by the half-width value (HWFM) of each field distribution in the drawing overlap by at least 10%, typically by at least 50%. Additionally or alternatively, the field distribution of the electrostatic lens component is within the field distribution of the magnetic field component.

Typically, it is desired in some applications that the amount of electrons impinging on the specimen equals the amount released or leaving the specimen. Charging of the specimen can be reduced or avoided. However, also positive or negative sample charging can be achieved by appropriate control voltages in combination with suitable landing energies, in the case in which sample charging is desired by the application. Accordingly, the sample charging can be controlled, e.g. via the charging of the sample stage 50 as can be seen in FIG. 4.

Further, a scanning deflector assembly 370 is provided. The scanning deflector assembly 370 can, for example, be a magnetic, but preferably an electrostatic scanning deflector assembly, which is configured for high pixel rates. According to typical embodiments, which can be combined with other embodiments described herein, the scanning deflector assembly 370 can be a single stage assembly as shown in FIG. 4. Alternatively also a two-stage or even a three-stage deflector assembly can be provided. Each stage may be provided at a different position along the optical axis 101.

According to some embodiments described herein, secondary and/or small angle backscattered electrons are extracted from the sample or wafer and are further accelerated within the objective lens. The beam separator 380 separates the primary and the secondary beam of secondary electrons and small angle backscattered electrons. The beam separator can be a Wien filter and/or can be at least one magnetic deflector, such that the signal electrons are deflected away from the optical axis 101. The secondary and/or small angle backscattered particles are then guided by a beam bender 392, e.g. a hemispherical beam bender, and a lens 394 to the second detector 398. Further elements like a filter 396 can be provided. According to yet further modifications, the second detector can be a segmented detector configured for detecting signal electrons depending on the starting angle at the sample.

According to embodiments described herein, a proxy electrode 130 is provided, which may be a proxy electrode as described in embodiments above, e.g. in FIGS. 1 to 2d.

The charged particle beam device as shown in FIG. 4 may include a first detector 120 or detection element for detecting the large angle backscattered particles (e.g. electrons) passing through the proxy electrode 130. The detection element 120 (e.g. a scintillator, pin diode, or other electron sensitive devices) may have different shapes according to measurement tasks. For instance, if only the total backscattered particle signal is of interest, a ring detector may be sufficient. According to some embodiments, for topography contrast detection, a 4-quadrant detector may be a possible choice. In some embodiments, different ring zones (which might be additionally segmented) may be used to detect specific parts of the angular backscattered particle distribution (such as angular and polar segmentation). By detecting specific parts of the angular distribution of the backscattered particle, depth information can be gathered. Gathering depth information enables the gathering of 3-D information of the composition of the sample (in particular structures with a high aspect ratio, as exemplarily shown in FIGS. 3b to 3e). By combining the detection of the angular distribution of the backscattered particles with varying landing energies of the primary beam, a kind of sample tomography can be achieved.

Typically, the detection arrangement for the backscattered particle is chosen and designed so that the detection arrangement does not have a substantial impact on the primary beam performance (such as the resolution of the primary beam). For instance, the working distance (WD) of the retarding field device as described above and as may be provided in the device shown in FIG. 4 by the objective lens and the proxy electrode, should not be increased to allow an efficient backscattered particle detection.

According to some embodiments, a tunable energy supply for the primary beam may be provided. Generally, the energy of the primary beam is chosen high enough so that released backscattered particles from an interesting depth can penetrate the surroundings (such as walls of a structure of the sample, as exemplarily shown in FIG. 3c). On the other hand, the energy of the primary beam is chosen so as not to be too high to avoid penetration into the deeper sample layers and reduce signal to noise ratio by unwanted depth information.

The potentials of the emitter, the column and the electrodes can be provided in the system according to any of the embodiments described herein. As a typical example the beam guiding tube may be on ground potential. Accordingly, the electrons travel through the column, which is on ground potential. The housing of the column can also be provided on ground potential. The housing being on ground potential is indicated by the reference numerals 3 in FIG. 4.

Figure 5:
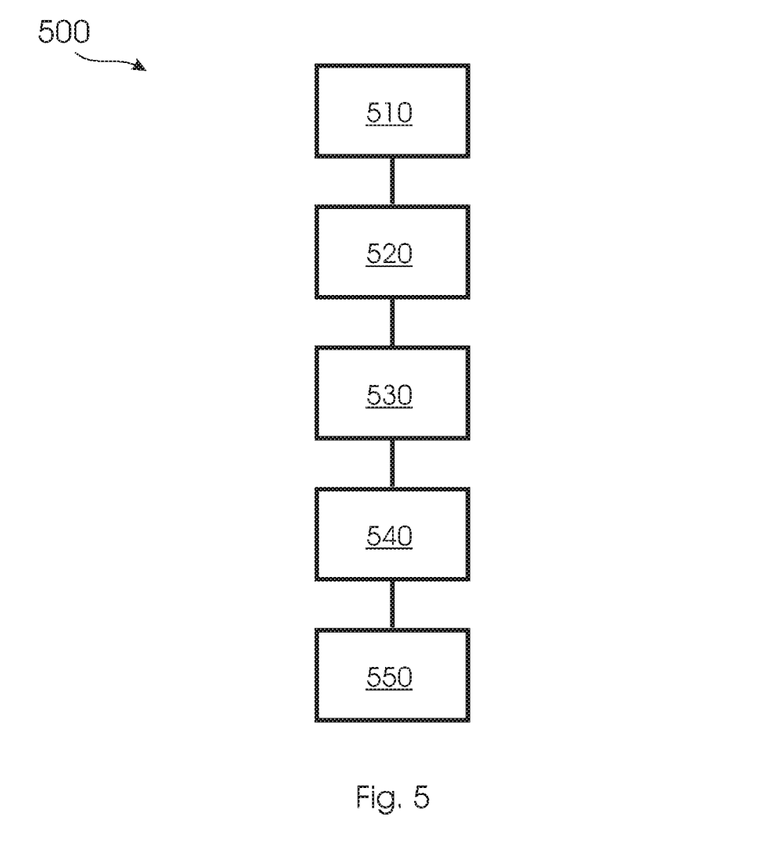
FIG. 5 shows a flow chart of a method for imaging and/or inspecting a sample by a charged particle beam device according to embodiments described herein.

FIG. 5 shows a flow chart of a method 500 for inspecting and/or imaging a sample with a charged particle beam according to embodiments described herein. Typically, the sample is inspected and/or images by a charged particle beam being provided by a charged particle beam device having a column, an optical axis, and a sample stage for supporting a sample during imaging and/or inspection. The method 500 includes in box 510 emitting a primary charged particle beam. The beam may be emitted by a beam emitter, as described above. Box 520 of the method 500 includes guiding the primary beam in the column of the charged particle beam device. According to some embodiments, the primary beam may be guided and shaped in the column of the charged particle beam device. For instance, optical elements may be provided for guiding and/or shaping the primary beam emitted from the emitter. FIG. 4 shows examples of optical elements, such as a condenser lens; an aperture, a beam separator, and the like. The skilled person may understand that the charged particle beam device may include additional or alternative optical elements, e.g. depending on the planned operation, the sample, the structures to be inspected and/or imaged, the energy used for the primary beam and the like.

According to embodiments described herein, the method 500 includes in box 530 focusing and retarding the primary particle beam by a retarding field device. Retarding the primary beam may be performed in an above mentioned range, such as retarding the primary beam to a landing energy on the sample of about 10 keV or less, e.g. 5 keV or less, such as 1 keV. Typically, the retarding field device includes a magnetic-electrostatic objective lens and a proxy electrode between the magnetic-electrostatic objective lens and the sample stage. The objective lens may be a lens as described above with reference to FIG. 1 or FIG. 4. The primary charged particle beam passes through the proxy electrode through a first opening. According to some embodiments, the first opening of the proxy electrode may be provided and arranged so as to coincide with the optical axis of the charged particle beam device, when mounted in the charged particle beam device. In some embodiments, the first opening of the proxy electrode may be an opening in the center of the proxy electrode.

According to some embodiments described herein, the primary beam—after having passed the first opening of the proxy electrode—impinges on the sample and causes signal particles (such as secondary particles and backscattered particles) to leave the sample, in particular in the direction away from the sample. The backscattered particles may include small angle backscattered particles and large angle backscattered particles. The angle ranges of small and large angles may be as described above. Typically, the large angle backscattered particles may be denoted as off-axial backscattered particles since the large angle backscattered particles spread from the optical axis of the charged particle beam device. The small angle backscattered particles may be denoted as axial backscattered particles, since the small angle backscattered particles stay near to the optical axis as shown in FIG. 1. In particular, the large angle backscattered particles or off-axial backscattered particles have a larger angle to the optical axis than the small angle backscattered particles (or axial backscattered particles).

According to embodiments described herein, box 540 includes the passing of off-axial backscattered particles through the proxy electrode through at least a second opening in the proxy electrode. FIGS. 2a to 2d show examples of second openings in the proxy electrode. Typically, the above described features of the second opening of the proxy electrode, and the proxy electrode as a whole, may also be applied to the method, in particular to the box 540 of the method 500.

Box 550 of method 500 includes detecting the backscattered particles by a first detector and detecting secondary particles released from the sample by a second detector. For instance, the second detector may be placed between the sample stage and the objective lens. In some embodiments, the first detector may be provided within the objective lens or outside the objective lens, e.g. after the objective lens in a direction of the secondary particles. According to some embodiments, the first detector and the second detector may be detectors as described in detail above with respect to the charged particle beam device.

In the following, examples according to embodiments will be described. The following examples may be combined with features described in the description and with other embodiments described herein as long as the features do not contradict each other.

In a first example, a particle beam device for imaging and/or inspecting a sample is described. The charges particle beam device includes a beam emitter for emitting a primary charged particle beam; and a retarding field device for retarding the primary beam before impinging on the sample. The retarding field device includes a magnetic-electrostatic objective lens and a proxy electrode. The charged particle beam device is adapted for guiding the primary beam along an optical axis to the sample for generating secondary particles released from the sample and backscattered particles. The proxy electrode includes a first opening allowing the passage of the primary beam and at least one second opening for allowing the passage of off-axial backscattered particles. According to a second example, which may be combined with the first example, the proxy electrode may include more than one second opening for allowing the passage of off-axial backscattered particles. In a third example, which may be combined with the first and/or second example, the proxy electrode may be adapted for allowing the passage of off-axial backscattered particles having an angle larger than 20° to the optical axis of the charged particle beam device. In a fourth example, which may be combined with any of the first to third examples, the at least one opening of the proxy electrode may have a ring segment-like shape, a circular shape, a grid-like structure or a rectangular shape. According to a fifth example, which may be combined with any of the first to fourth examples, the charged particle beam device may include a first detector for backscattered particles between the proxy electrode and the magnetic-electrostatic objective lens. In a sixth example, which may be combined with any of the first to fifth example, the charged particle beam device may further include a sample stage for supporting the sample, wherein the distance between the proxy electrode and the sample stage is smaller than the distance between the magnetic-electrostatic objective lens and the sample stage. In a seventh example, which may be combined with any of the first to sixth example, the charged particle beam may further include a conductive grid superimposed onto the proxy electrode for reducing an electrical field penetration from the column of the charged particle beam device to the sample, in particular for avoiding or reducing an impact on the primary beam. According to an eighth example, which may be combined with any of the first to seventh example, the proxy electrode may at least partially be shaped as a grid with a central hole for the primary beam. In a ninth example, which may be combined with any of the first to eighth examples, a first detector for the backscattered particles may be provided within the magnetic-electrostatic objective lens. According to a tenth example, which may be combined with any of the first to ninth examples, the retarding field lens device may provide a potential difference between the sample and the column of the charged particle beam device of between 3 keV and 30 keV.

In an eleventh example, which may be combined with any of the first to tenth examples, the charged particle beam device may further include a second detector for secondary particles being released from the sample upon impingement of the primary beam; in particular, the retarding field lens device is adapted for generating an extraction field for the secondary particles. According to a twelfth example, which may be combined with any of the first to tenth examples, the charged particle beam device may further include a second detector for secondary particles being released from the sample upon impingement of the primary beam, the second detector for the secondary particles being provided after the objective lens when seen in the travelling direction of the secondary particles, wherein the charged particle beam device allows to separately detect the secondary particles and the backscattered particles. In a thirteenth example, which may be combined with any of the first to twelfth example, the proxy electrode may be configured to be a substantially equi-energetic plane for the primary beam, e.g. by providing a grid for the proxy electrode. In a fourteenth example, which may be combined with any of the first to thirteenth example, the proxy electrode may be adapted for acting as an entrance window for a first detector for off-axial backscattered particles between the proxy electrode and the magnetic-electrostatic objective lens. In a fifteenth example, which may be combined with any of the first to fourteenth example, the first opening coincides with the optical axis of the charged particle beam. In a sixteenth example, which may be combined with any of the first to fifteenth example, the emitter may be adapted for emitting a primary electron beam travelling through the column of the electron beam device and the charged particle beam device may further include a sample stage for supporting a sample to be imaged and/or inspected; electron beam optical devices for guiding the primary beam along the optical axis to the sample for generating secondary electrons released from the sample and backscattered electrons; and a first detector for detecting the backscattered electrons, the first detector being provided between the sample stage and the magnetic-electrostatic objective lens. In a seventeenth example, a proxy electrode for a charged particle beam device may be provided. The proxy electrode may include a first opening allowing the passage of a primary charged particle beam of the charged particle beam device, and at least one second opening for allowing the passage of off-axial backscattered particles of the charged particle beam device. According to a eighteenth example, which may be combined with the seventeenth example, the second opening of the proxy electrode may allow backscattered particles to pass through the second opening, the backscattered particles having an angle larger than 20° to the optical axis of the electron beam device. In a nineteenth example, a method for imaging and/or inspecting a sample by a charged particle beam device having a column and an optical axis may be provided. The method may include emitting a primary beam of charged particles; guiding the primary beam in the column of the charged particle beam device; focusing and retarding the primary beam by a retarding field device, the retarding field device including a magnetic-electrostatic objective lens and a proxy electrode between the magnetic-electrostatic objective lens and a sample stage for supporting a sample during imaging and/or inspection, wherein the primary charged particle beam may pass through the proxy electrode through a first opening; passing of off-axial backscattered particles through the proxy electrode through at least a second opening in the proxy electrode; and detecting the backscattered particles by a first detector and detecting secondary particles released from the sample by a second detector. According to a twentieth example, which may be combined with the nineteenth example, the off-axial backscattered particles may pass through the proxy electrode, the backscattered particles having an angle larger than 20° to the optical axis.

While the foregoing is directed to embodiments, other and further embodiments may be devised without departing from the basic scope, and the scope thereof is determined by the claims that follow.

The invention claimed is:

1. Charged particle beam device for imaging and/or inspecting a sample, comprising:
   a beam emitter for emitting a primary charged particle beam; and
   a retarding field device for retarding the primary beam before impinging on the sample, the retarding field device comprises a magnetic-electrostatic objective lens and a proxy electrode;
   wherein the charged particle beam device is adapted for guiding the primary beam along an optical axis to the sample for generating secondary particles released from the sample and backscattered particles;
   wherein the proxy electrode comprises a first opening allowing the passage of the primary beam and at least one second opening for allowing the passage of off-axial backscattered particles.

2. The charged particle beam device according to claim 1, wherein the proxy electrode comprises more than one second opening for allowing the passage of off-axial backscattered particles.

3. The charged particle beam device according to claim 1, wherein the proxy electrode is adapted for allowing the passage of off-axial backscattered particles having an angle larger than 20° to the optical axis of the charged particle beam device.

4. The charged particle beam device according to claim 1, wherein the at least one opening of the proxy electrode has a ring segment-like shape, a circular shape or a rectangular shape.

5. The charged particle beam device according to claim 1, wherein the charged particle beam device comprises a first detector for backscattered particles between the proxy electrode and the magnetic-electrostatic objective lens.

6. The charged particle beam device according to claim 1, further comprising a sample stage for supporting the sample, wherein the distance between the proxy electrode and the sample stage is smaller than the distance between the magnetic-electrostatic objective lens and the sample stage.

7. The charged particle beam device according to claim 1, further comprising a conductive grid superimposed onto the proxy electrode for reducing an electrical field penetration from the column of the charged particle beam device to the sample.

8. The charged particle beam device according to claim 1, wherein the proxy electrode is at least partially shaped as a grid with a central hole for the primary beam.

9. The charged particle beam device according to claim 1, wherein a first detector for the backscattered particles is provided within the magnetic-electrostatic objective lens.

10. The charged particle beam device according to claim 1, wherein the retarding field device provides a potential difference between the sample and the column of the charged particle beam device of between 3 keV and 30 keV.

11. The charged particle beam device according to claim 1, further comprising a second detector for secondary particles being released from the sample upon impingement of the primary beam and wherein in particular the retarding field device is adapted for generating an extraction field for the secondary particles.

12. The charged particle beam device according to claim 1, further comprising a second detector for secondary particles being released from the sample upon impingement of the primary beam, the second detector for the secondary particles being provided after the objective lens when seen in the travelling direction of the secondary particles, wherein the charged particle beam device allows to separately detect the secondary particles and the backscattered particles.

13. The charged particle beam device according to claim 1, wherein the proxy electrode is configured to be a substantially equi-energetic plane for the primary beam.

14. The charged particle beam device according to claim 1, wherein the proxy electrode is adapted for acting as an entrance window for a first detector for off-axial backscattered particles between the proxy electrode and the magnetic-electrostatic objective lens.

15. The charged particle beam device according to claim 1, wherein the first opening coincides with the optical axis of the charged particle beam.

16. An electron beam device according to claim 1, wherein:
the emitter is adapted for emitting a primary electron beam travelling through the column of the electron beam device;
further comprising:
a sample stage for supporting a sample to be imaged and/or inspected;
electron beam optical devices for guiding the primary beam along the optical axis to the sample for generating secondary electrons released from the sample and backscattered electrons; and
a first detector for detecting the backscattered electrons, the first detector being provided between the sample stage and the magnetic-electrostatic objective lens.

17. Method for imaging and/or inspecting a sample by a charged particle beam device having a column and an optical axis, the method comprises:
emitting a primary beam of charged particles;
guiding the primary beam in the column of the charged particle beam device;
focusing and retarding the primary beam by a retarding field device, the retarding field device comprising a magnetic-electrostatic objective lens and a proxy electrode between the magnetic-electrostatic objective lens and a sample stage for supporting a sample during imaging and/or inspection, wherein the primary charged particle beam passes through the proxy electrode through a first opening;
passing of off-axial backscattered particles through the proxy electrode through at least a second opening in the proxy electrode; and
detecting the backscattered particles by a first detector and detecting secondary particles released from the sample by a second detector.

18. The method according to claim 17, wherein the off-axial backscattered particles pass through the proxy electrode having an angle larger than 20° to the optical axis.

* * * * *